(12) United States Patent
Yamamoto (10) Patent No.: US 7,982,851 B2
(45) Date of Patent: Jul. 19, 2011

(54) METHOD FOR MEASURING FLARE AMOUNT, MASK FOR MEASURING FLARE AMOUNT, AND METHOD FOR MANUFACTURING DEVICE

(75) Inventor: Tomohiko Yamamoto, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 250 days.

(21) Appl. No.: 11/387,781

(22) Filed: Mar. 24, 2006

(65) Prior Publication Data

US 2007/0146662 A1  Jun. 28, 2007

(30) Foreign Application Priority Data

Dec. 27, 2005 (JP) .................................. 2005-376024

(51) Int. Cl.
*G03B 27/52* (2006.01)
*G03B 27/32* (2006.01)

(52) U.S. Cl. .................................... 355/52; 355/77

(58) Field of Classification Search ............... 355/52, 355/53, 77; 430/5, 30
See application file for complete search history.

(56) References Cited

U.S. PATENT DOCUMENTS

| | | | |
|---|---|---|---|
| 6,396,569 B2 * | 5/2002 | Zheng et al. | 355/77 |
| 6,490,031 B1 * | 12/2002 | Goldstein et al. | 356/121 |
| 6,900,887 B2 * | 5/2005 | Kim | 356/218 |
| 7,264,907 B2 | 9/2007 | Watanabe | |
| 2004/0023130 A1 * | 2/2004 | Yao et al. | 430/5 |
| 2004/0196447 A1 * | 10/2004 | Watanabe | 355/77 |
| 2005/0026050 A1 * | 2/2005 | Ozawa et al. | 430/5 |
| 2005/0095510 A1 * | 5/2005 | Yamamoto et al. | 430/5 |
| 2005/0102648 A1 * | 5/2005 | Hsu et al. | 716/19 |
| 2005/0170264 A1 * | 8/2005 | Hukuhara | 430/5 |
| 2005/0275820 A1 * | 12/2005 | Fukuhara et al. | 355/69 |
| 2006/0019179 A1 * | 1/2006 | Leunissen et al. | 430/5 |
| 2006/0046167 A1 * | 3/2006 | Wu et al. | 430/30 |
| 2006/0080046 A1 * | 4/2006 | Ziger et al. | 702/32 |

FOREIGN PATENT DOCUMENTS

| | | |
|---|---|---|
| JP | 9-97760 A | 4/1997 |
| JP | 2003-318095 A | 11/2003 |
| JP | 2004-296648 A | 10/2004 |
| JP | 2007-501508 A | 1/2007 |
| WO | 2005-008754 A1 | 1/2005 |
| WO | 2005-013004 A2 | 2/2005 |
| WO | WO 2005013004 A2 * | 2/2005 |

OTHER PUBLICATIONS

J.P. Kirk, "Scattered Light in Photolithographic Lense" Proc. SPIE, 1994, vol. 2197, pp. 566-572.
Japanese Office Action dated Nov. 16, 2010, issued in corresponding Japanese Patent Application No. 2005-376024.

* cited by examiner

*Primary Examiner* — Hung Henry Nguyen
*Assistant Examiner* — Steven H Whitesell-Gordon
(74) *Attorney, Agent, or Firm* — Westerman, Hattori, Daniels & Adrian, LLP (57) ABSTRACT

An amount is flare is measured by a method including steps of applying a photosensitive material to a substrate; exposing a part of the photosensitive material using a mask including a transmitting section which has no pattern so that the part of the photosensitive material varies in thickness; and measuring an amount of flare based on a distribution of film amounts of the photosensitive material remaining in a first region corresponding to the transmitting section and on a second region other than the first region after the step of exposing.

11 Claims, 10 Drawing Sheets

METHOD FOR MEASURING FLARE AMOUNT, MASK FOR MEASURING FLARE AMOUNT, AND METHOD FOR MANUFACTURING DEVICE

CROSS REFERENCE TO RELATED APPLICATIONS

This application is based on and hereby claims priority to Japanese Application No. 2005-376024 filed on Dec. 27, 2005 in Japan, the contents of which are hereby incorporated by reference.

BACKGROUND OF THE INVENTION

1. Field of the Invention

The present invention relates to a method for measuring an amount of flare, a mask used for measuring an amount of flare, and a method for manufacturing a device which are preferably used in lithography using a photoresist (a photosensitive material) to form a pattern.

2. Description of the Related Art

In accordance with recent high integration of semiconductor elements, patterns formed by lithographical methods have become finer and finer.

Such finer design requires a smaller range for evenness of dimensions.

Some reasons for worsening dimension evenness are flare (scattered or stray light) generated from a projection optical system and an illumination system part incorporated in an exposure unit, amount of exposure, and distribution of intensity of illumination.

The reasons for occurrence are deterioration of and/or a stain on optical parts that form a projection optical system and an illumination system part incorporated in an exposure unit.

For example, increase in amount of flare generated from an illumination system part is a cause of a large difference in resist dimensions between the center and an edge of the exposure region of an exposure shot, which difference affects evenness of dimensions.

For example, increase in amount of flare generated from projection optical system (a projection optical lens system) is a cause of stray light that achieves unexpected area of the exposure region of an exposure shot, which stray light worsens evenness of dimensions.

Decline in dimension evenness for either reason results in decline in device performance and in yield.

For this reason, in manufacturing a device of 90 nm generation or later, those in the art consider that quantitative measurement of an accurate flare amount is required for apparatus management.

The Kirk method has been commonly and widely used as a convenient method for measuring a flare amount (cf., Scattered light in photolithographic lenses Proc. SPIE, 1994, vol. 2197).

The Kirk method transfers a mask pattern having a transmitting section of a several-hundred-μm level and a shading section of a several-μm level formed inside the transmitting section to a photoresist, and then obtains a ratio between an exposure amount irradiated until a photoresist in the position corresponding to the transmitting section other than the shading section disappears and an exposure amount irradiated until a photoresist in the position corresponding to the shading section disappears, which ratio is defined as an amount of flare.

SUMMARY OF THE INVENTION

In Kirk, since whether or not a photoresist disappears is confirmed by observation with a microscope, the result of confirmation may differ among operators. As a result, it is difficult to quantitatively measure an amount of flare and the measured amount is not very accurate.

Limitation to a position of a shading section makes it impossible to measure an amount of flare over the entire region. In other words, Kirk cannot measure an amount of flare that reaches a region other than a shading section that has been set on a predetermined position.

With the foregoing problems in view, the object of the present invention is to provide a method for measuring an amount of flare, a mask used for measuring an amount of flare, and a method for manufacturing a device which can accurately measure an amount of flare in a simple process.

To attain the above object, as the first generic feature, there is provided a method for measuring an amount of flare, comprising the steps of: (a) applying a photosensitive material to a substrate; (b) exposing a part of the photosensitive material using a mask including a transmitting section which has no pattern so that the part of the photosensitive material varies in thickness; and (c) measuring an amount of flare based on a distribution of film amounts of the photosensitive material remaining in a first region corresponding to the transmitting section and on a second region other than the first region after the step (b) of exposing.

As the second generic feature, there is provided a method for manufacturing a device comprising a process for measuring an amount of flare of the present invention.

As the third generic feature, there is provided a mask used in measurement of an amount of flare comprising a plurality of line patterns which are arranged in a direction of scanning and which have different pitches at which lines are arranged.

As the fourth generic feature, there is provided a mask used in measurement of an amount of flare comprising a line pattern in which a plurality of lines are arranged at different pitches relative to the direction of scanning.

As the fifth generic feature, there is provided a mask used in measurement of an amount of flare comprising a plurality of line patterns in blocks in which lines are arranged at equal pitches and which line patterns are arranged in different directions respectively to relative a direction of scanning.

Advantageously, a method for measuring an amount of flare and a mask used for measuring an amount of flare of the present invention can accurately measure an amount of flare in a simple process.

In particular, if a routine check is performed on an apparatus used for manufacturing a device by the method for manufacturing a device of the present invention, time to replace and clean optical parts, for example, can be properly determined with ease so that, advantageously, the apparatuses used in manufacturing can be easily managed. Further, replacement or cleaning of optical parts can avoid decline in evenness of dimensions beforehand, resulting in prohibited decline in device performance and in yield.

Other objects and further features of the present invention will be apparent from the following detailed description when read in conjunction with the accompanying drawings.

BRIEF DESCRIPTION OF THE DRAWINGS

FIGS. 1(A)-1(C) are diagrams showing a method for measuring an amount of flare according to the first embodiment of the present invention, specifically.

DESCRIPTION OF THE PREFERRED EMBODIMENTS

Various preferred embodiments of the present invention will now be described with reference to the accompanying drawings.

(a) First Embodiment

A method for measuring an amount of flare, a mask for measuring an amount of flare, and a method for manufacturing a device according to the first embodiment will now be described with reference to FIGS. 1(A)-1(C), 2(A), 2(B), 3 and 4.

A method for measuring an amount of flare according to the present embodiment is used in, for example, measurement of a flare amount caused by exposure in lithography when manufacturing semiconductor devices or display devices such as liquid crystal displays.

In the present invention, a flare amount is measured in the following manner

First of all, a resist 3 (a photosensitive material, a photoresist,) is applied to a wafer 1 (a semiconductor substrate, an Si substrate, here) interposed by a BARC (Bottom Anti-Reflection Coating) 2.

Figure 2A:
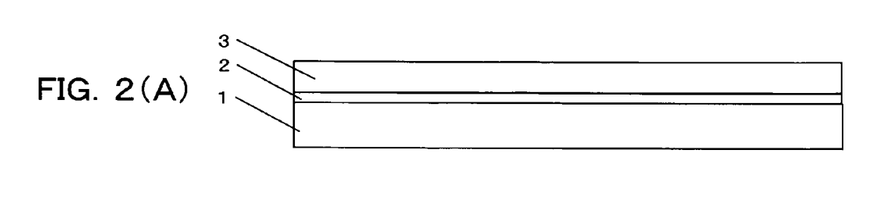
FIGS. 2(A) and 2(B) are sectional views schematically showing the flare measuring method according to the first embodiment.
Figure 2B:
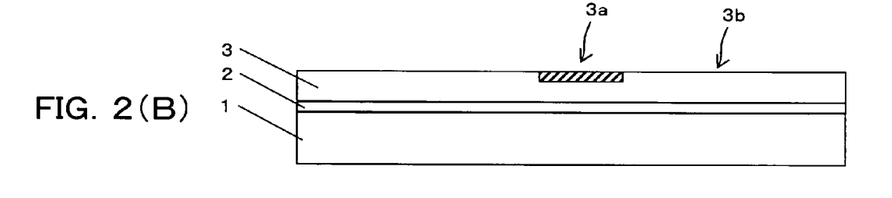

Then, a part of the resist 3 is exposed to light using a mask 4 (for measuring a flare amount, reticle) shown in FIG. 3 so that a part of the resist varies in thickness after the development process (described below) as shown in FIG. 2(B).

The present embodiment uses a mask 4 including a transmitting section 4a and a shading section (opaque section) 4b covered with a shading film (a light-shield film) made from Cr and/or other material. The transmitting section 4a takes the form of a quadrilateral surrounded by the shading section 4b. The transmitting section 4a is a region all of which transmits light and has no pattern. The present measuring method uses this mask 4 because flare seems to be caused by light (0th light) which goes straight through the mask 4.

Using this mask 4, the resist 3 is exposed by light with an exposure amount (a low exposure amount) to such an extent that the resist 3 applied to a region (an exposed region) 3a corresponding to the transmitting section 4a of the mask 4 is not completely removed (partially removed) as shown in FIG. 2(B) in order to transfer the mask pattern (in the illustrated example, a pattern identical to the quadrilateral transmitting section 4a surrounded by the shading section 4b) onto the wafer 1 to which the resist 3 has been applied. In FIG. 2(B), reference number 3b represents a region (shading region) corresponding to the shading section 4b of the mask 4.

Figure 1A:
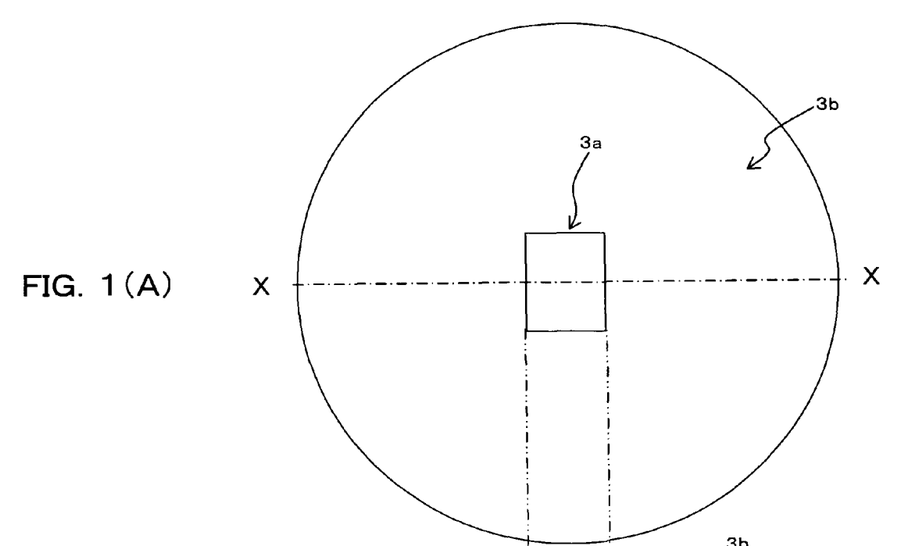
FIG. 1(A) is a schematic plain view.
Figure 1B:
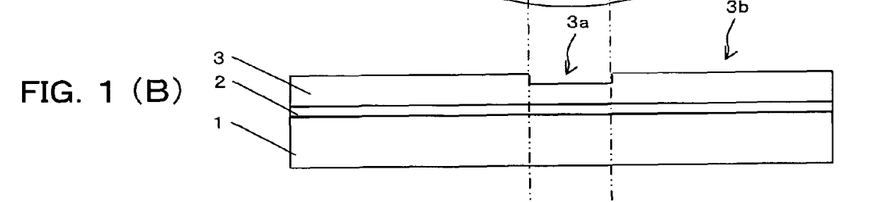
FIG. 1(B) is a schematic sectional view and FIG. 1(C) is a graph showing a remaining film amount of resist.

After that, a PEB (Post Exposure Bake) process and development process are carried out, so that a resist pattern corresponding to the mask pattern is formed as shown in FIGS. 1(A) and 1(B).

Alternatively, the resist 3 may be one that varies in thickness only by irradiation with light. In the case where such a resist is used, there is no need to carry out PEB and development processes.

In the present embodiment, since the resist 3 is exposed by light with a low exposure amount such that a part of the resist 3 on the exposed region 3a remains on the substrate 1, the resist 3 on the exposed region 3a after the development process is thinner than that on the shading region 3b other than the transmitting section 3a.

Figure 1C:
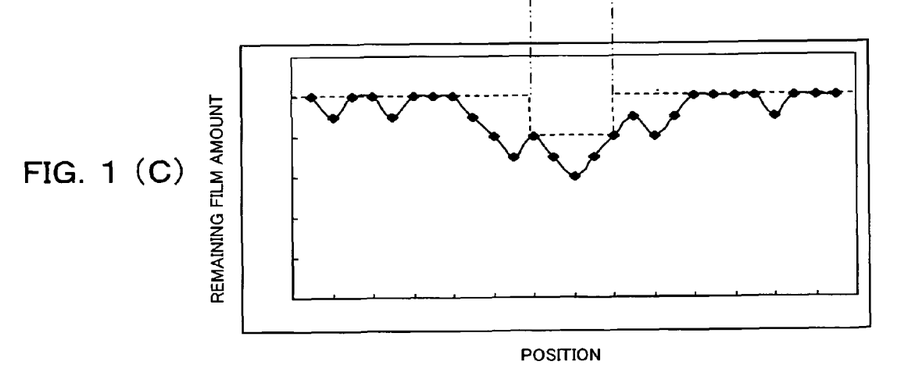

After forming the resist pattern in the above manner, an amount of flare is measured based on the film amount of the resist 3 remaining (a distribution of remaining film amounts) as shown in FIGS. 1(A)-1(C).

Measurement of a flare amount uses a remaining film amount because unevenness of exposure caused by flare and unevenness of illumination is represented by variation in thickness of the resist 3.

First of all, the amount of film of the resist 3 remaining in the entire region to which the resist 3 has been applied (i.e., the thickness of the resist 3) is measured. In other words, as well as a film amount of the resist 3 remaining in the exposed region (shot region) 3a corresponding to the transmitting section 4a of the mask 4, a film amount of the resist remaining in the shading region 3b other than the exposed region 3a is measured because unevenness of exposure caused by flare appears also in the shading region 3a.

The film thickness of the resist 3 can be easily measured with a reflective thickness meter, an ellipsometer, a step height meter and others.

Next, on the basis of the result of the measurement, the method obtains a distribution of remaining film amounts (a distribution of film thickness) of the resist 3 as shown by the solid line in FIG. 1(C). The distribution of remaining resist film amounts here concerns the entire region to which the resist 3 has been applied.

Then, on the basis of the distribution of measured film amounts of the remaining resist and a distribution of film amounts of remaining resist presumed at the designing stage as shown by the broken line of FIG. 1(C), the difference of the measured film amounts of the remaining resist and the presumed film amounts of the remaining resist in each position is calculated, and an amount of flare is obtained by adding the above differences.

In this manner, positions at which flare appears can be specified and an amount of flare can be quantitatively determined.

Strictly, since the exposed region 3a corresponding to the transmitting section 4a of the mask 4 is thin in film thickness because of flare and unevenness of illumination, the difference between the measured film amount and the presumed film amount in this region 3a includes affect of unevenness of illumination.

For this reason, it is preferable that unevenness of illumination at the exposed region 3a corresponding to the transmitting section 4a of the mask 4 is measured using, for example, an illuminometer to determine the extent of the affect caused by the illumination unevenness and then an exact flare amount is determined by subtracting the effect of illumination unevenness from the difference. Measurement of a flare amount based on the remaining film amount of the resist 3 and intensity of illumination extracts only affect caused by flare from the remaining resist film amount, and thereby a more accurate flare amount can be measured.

In the method for measuring an amount of flare according to the present embodiment, it is advantageously possible to measure an exact amount of flare with ease.

In particular, if a routine check performed during the manufacturing process of devices uses the method for measuring an amount of flare of the present invention, it is possible to properly determine the time for replacement or cleaning of optical parts so that, advantageously, machineries used for manufacturing devices can be managed with ease. Replacement and cleaning of optical parts can avoid decline in evenness of dimensions beforehand, resulting in prohibited decline in device performance and in yield.

In the first embodiment, a part of the resist (photosensitive material) 3 is exposed by light, using the mask 4 so that the part varies in thickness. But the present invention should by no means be limited to this. The present invention can be applied also to a maskless lithography in which exposure is carried out by irradiation with EB (electron beam) or ion beam.

The above method for measuring an amount of flare can be incorporated in a process for manufacturing devices such as semiconductor devices and display devices exemplified by liquid crystal. In other words, a method for manufacturing a device can include a process for measuring an amount of flare using the flare measuring method according to the present embodiment.

For example, the method for measuring an amount of flare of the first embodiment can be used for routine checking (for example, carried out once a month) on an exposure unit.

Figure 4:
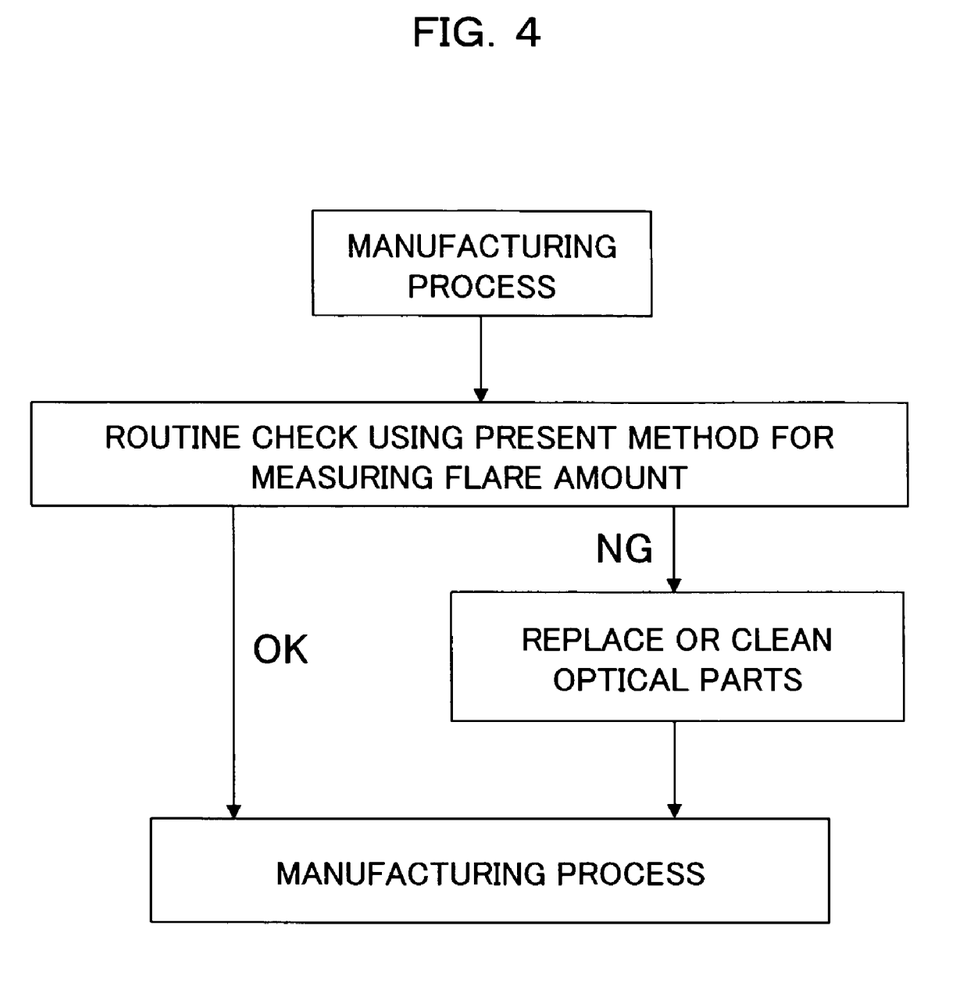
FIG. 4 is a flow diagram showing a method for manufacturing a device according to the first embodiment.

Further, it is possible to carry out routine checks using the method for measuring an amount of flare of the present embodiment during a process for manufacturing devices, as shown in FIG. 4.

More specifically, a method for manufacturing a device in which a process for routine checking is incorporated is carried out in the following manner.

In a process for routine checking carried out during a process for manufacturing a device, whether or not an amount of flare measured in the method for measuring an amount of flare of the first embodiment is a predetermined value or more is determined.

If the flare amount is determined to be the predetermined value or more (NG route), optical parts are replaced or cleaned and then manufacturing of devices restarts.

Conversely, if the flare amount is determined to be less than the predetermined value (OK route), manufacturing of devices continues.

(b) Second Embodiment

A method for measuring an amount of flare, a mask used for measuring an amount of flare, and a method for manufacturing a device according to the second embodiment will now be described with reference to FIGS. 5 and 6.

Figure 3:
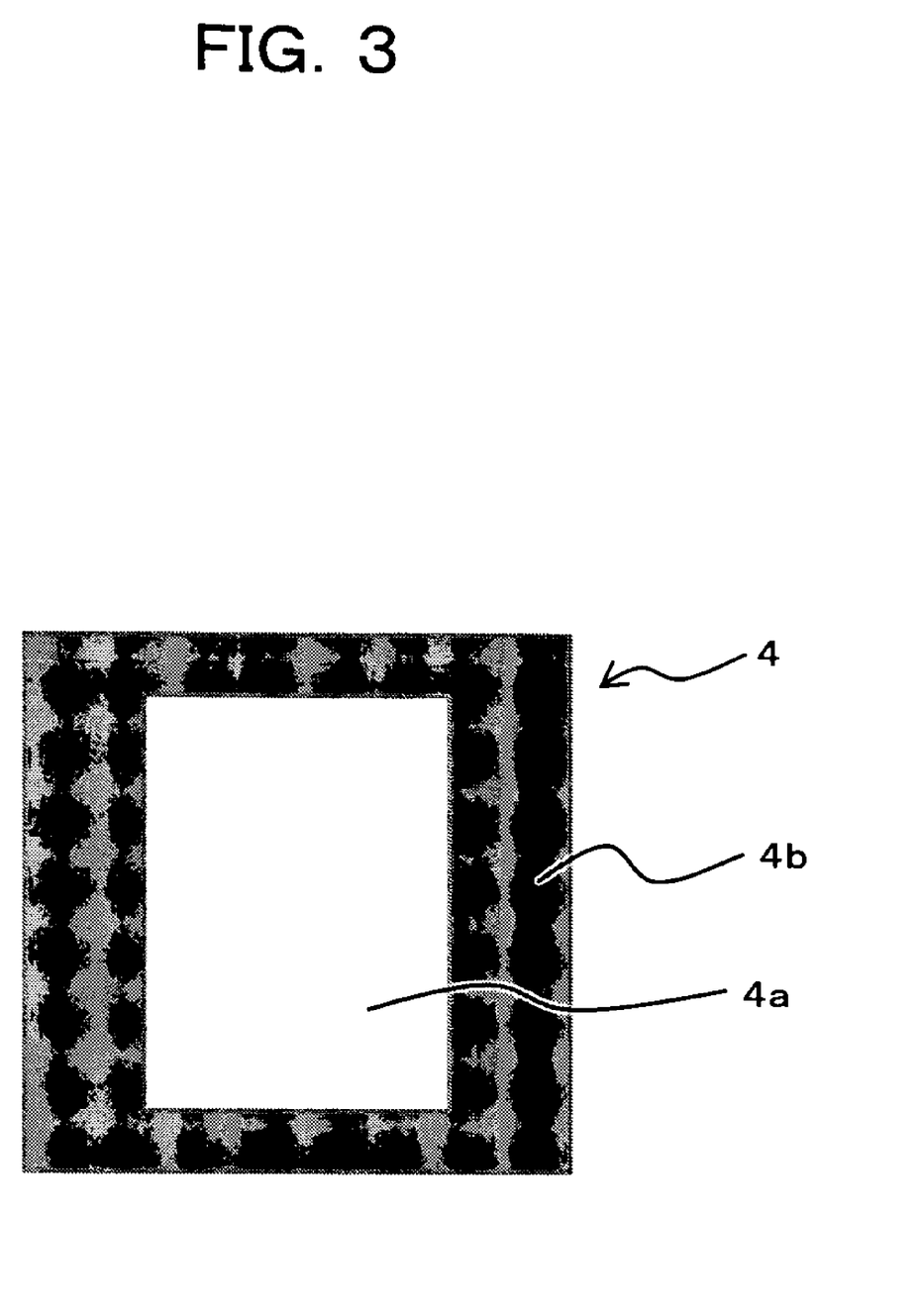
FIG. 3 is a plain view schematically showing a mask used for measuring a flare amount in the method for measuring an amount of flare according to the first embodiment.
Figure 5:
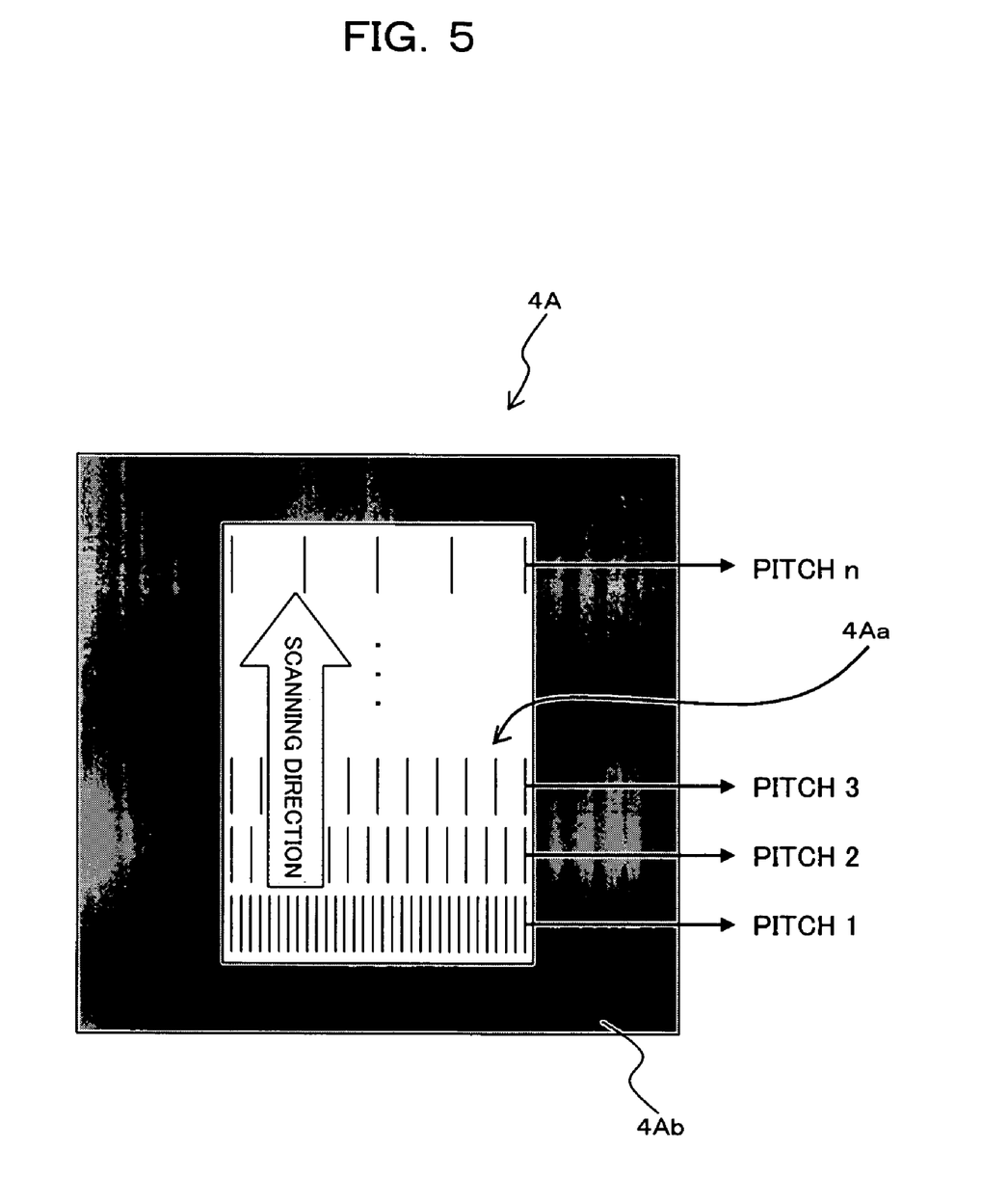
FIG. 5 is a plain view schematically showing a mask used for measuring a flare amount in a method for measuring an amount of flare according to the second embodiment of the present invention.
Figure 6:
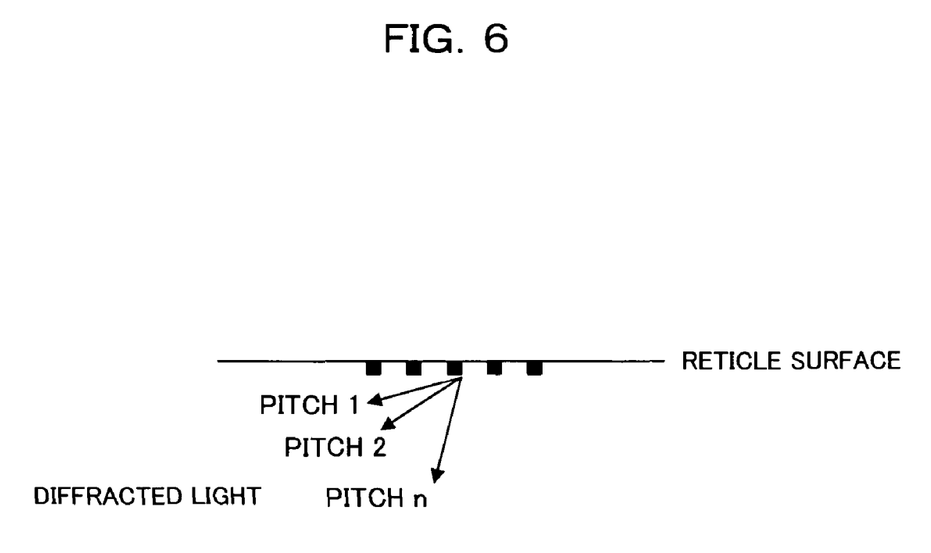
FIG. 6 is a diagram schematically showing angles of diffracted light in accordance with pitches when the mask for measuring an amount of flare of FIG. 5 is used.

A mask used for measuring an amount of flare according to the second embodiment is, as shown in FIG. 5, different in mask pattern from that used in the first embodiment (see FIG. 3).

Specifically, the mask 4A (a mask used for measuring an amount of flare, a reticle) has a number of line patterns which have different pitches (Pitch 1, Pitch 2, Pitch 3, . . . Pitch n) at which lines are arranged, as shown in FIG. 5. These line patterns 4Aa are extending in a direction perpendicular to the scanning direction, being arranged in series in the scanning direction. The reference number 4Ab in FIG. 5 represents a shading section.

In the illustrated example, each line pattern 4Aa has a number of lines extending in a scanning direction, being arranged in a direction perpendicular to the scanning direction. The line patterns 4Aa have difference pitches becoming wider downstream in the scanning direction stepwise.

With the presence of the line patterns 4Aa that have different pitches, since light diffracts at predetermined angle, a position of flare caused by diffracted light can be specified and an amount of flare caused by diffracted light can be quantitatively measured.

In particular, when the mask has line patterns 4Aa which have different pitches, light diffracted by the line patterns 4Aa formed on the mask surface (the reticle surface) is different in angle from the line patterns. Therefore, the position and the amount of flare in accordance with angles of diffracted light can be specified and quantitatively measured, respectively. This specification and measurement utilize the characteristics that light is diffracted at different angles by line patterns that have different pitches.

If such a mask is used to measure a flare amount, dimensions, such as the length of each line and pitches between lines of the patterns (the resist pattern) transferred to the resist 3 should be measured as well as a film thickness (a remaining film amount) of the resist 3 remaining. An amount of flare caused by diffracted light is measured based on the remaining film amount of the resist 3 and the dimensions of the transferred pattern.

The mask configuration, the method for measuring an amount of flare, and the method for manufacturing a device of the present embodiment are identical to those of the first embodiment, so repetitious description is omitted here.

According to the method for measuring an amount of flare, the mask used for measuring an amount of flare, and the method for manufacturing a device of the second embodiment, it is possible to accurately measure an amount of flare caused by diffracted light in a simple manner.

Especially, if a routine check is performed using the method measuring an amount of flare during a process for manufacturing a device, time to replace and clean, optical parts, for example, can be properly determined with ease so that apparatuses used in device manufacturing can be easily managed. Further, replacement or cleaning of optical parts can avoid decline in evenness of dimensions beforehand, resulting in prohibited decline in device performance and in yield.

A mask pattern (line pattern) on a mask used for measuring an amount of flare caused by diffracted light is not limited to that described in the second embodiment.

Figure 7:
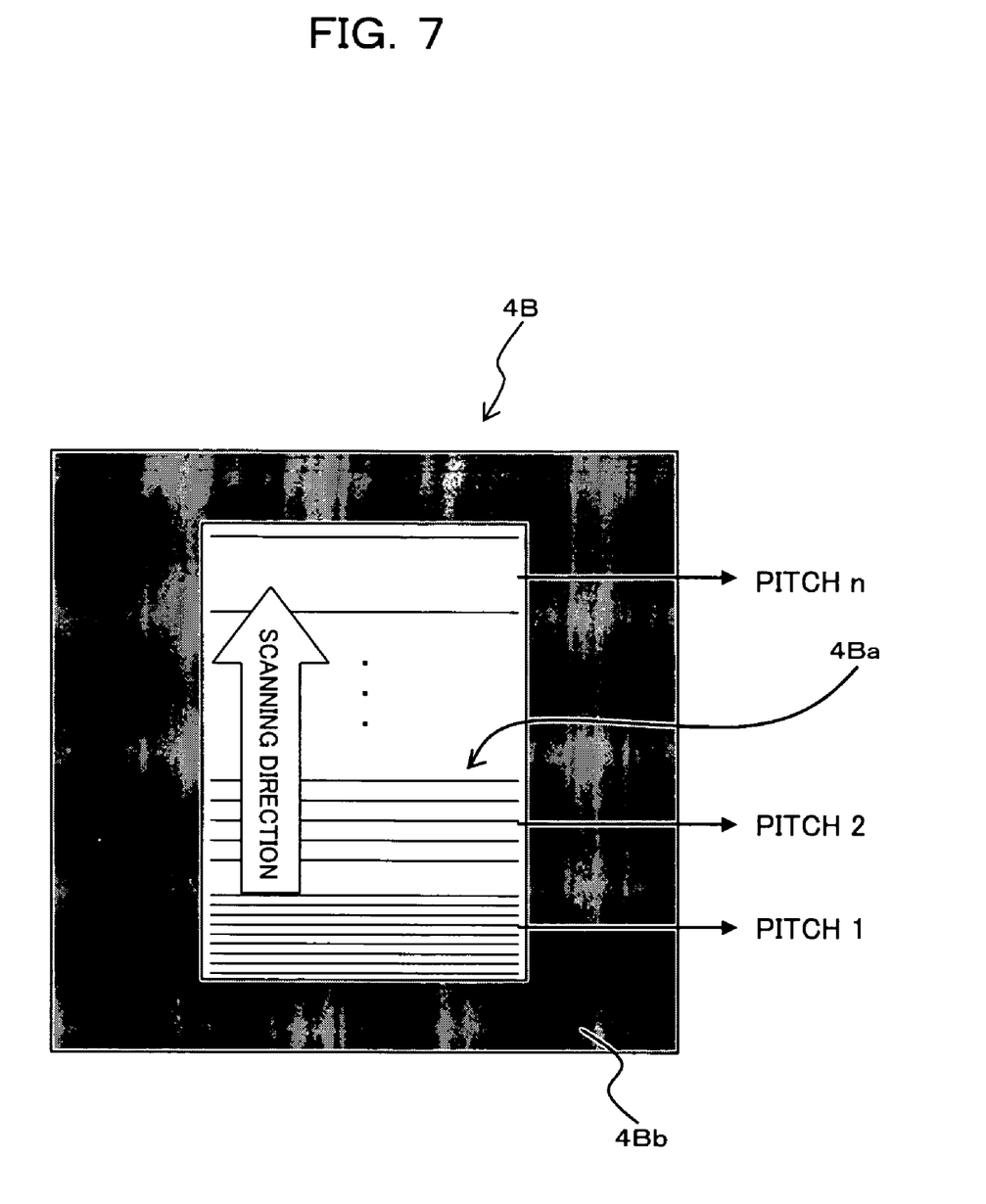
FIG. 7 is a plain view schematically showing a mask used for measuring a flare amount in a method for measuring an amount of flare according to a modification to the second embodiment of the present invention.

For example, a mask 4B may have a line pattern 4Ba in which a plurality of lines are arranged at different pitches (intervals) relative to the scanning direction, as shown in FIG. 7. In detail, the line pattern 4Ba may have a plurality of lines arranged at different pitches (Pitch 1, Pitch 2, Pitch 3, . . . Pitch n) which sequentially vary in the scanning direction. In addition, reference number 4Bb in FIG. 7 represents a shading section.

In this case, the line pattern 4Ba is formed by a plurality of lines that extend in a direction perpendicular to the scanning direction and that are arranged in the scanning direction to have different pitches that vary sequentially.

With the mask 4B, the present method can measure an amount of flare (scattered or stray light) caused by light diffracted in a direction of 90 degrees to light diffracted by the mask 4A described in the second embodiment.

Alternatively, with a mask having a line pattern formed by lines arranged at an arbitrary angle relative to the scanning direction, scattered or stray light occurring at the arbitrary angle can be measured.

(c) Third Embodiment

A method for measuring an amount of flare, a mask used for measuring an amount of flare, and a method for manufacturing a device according to the third embodiment will now be described with reference to FIGS. 8-10.

Figure 8:
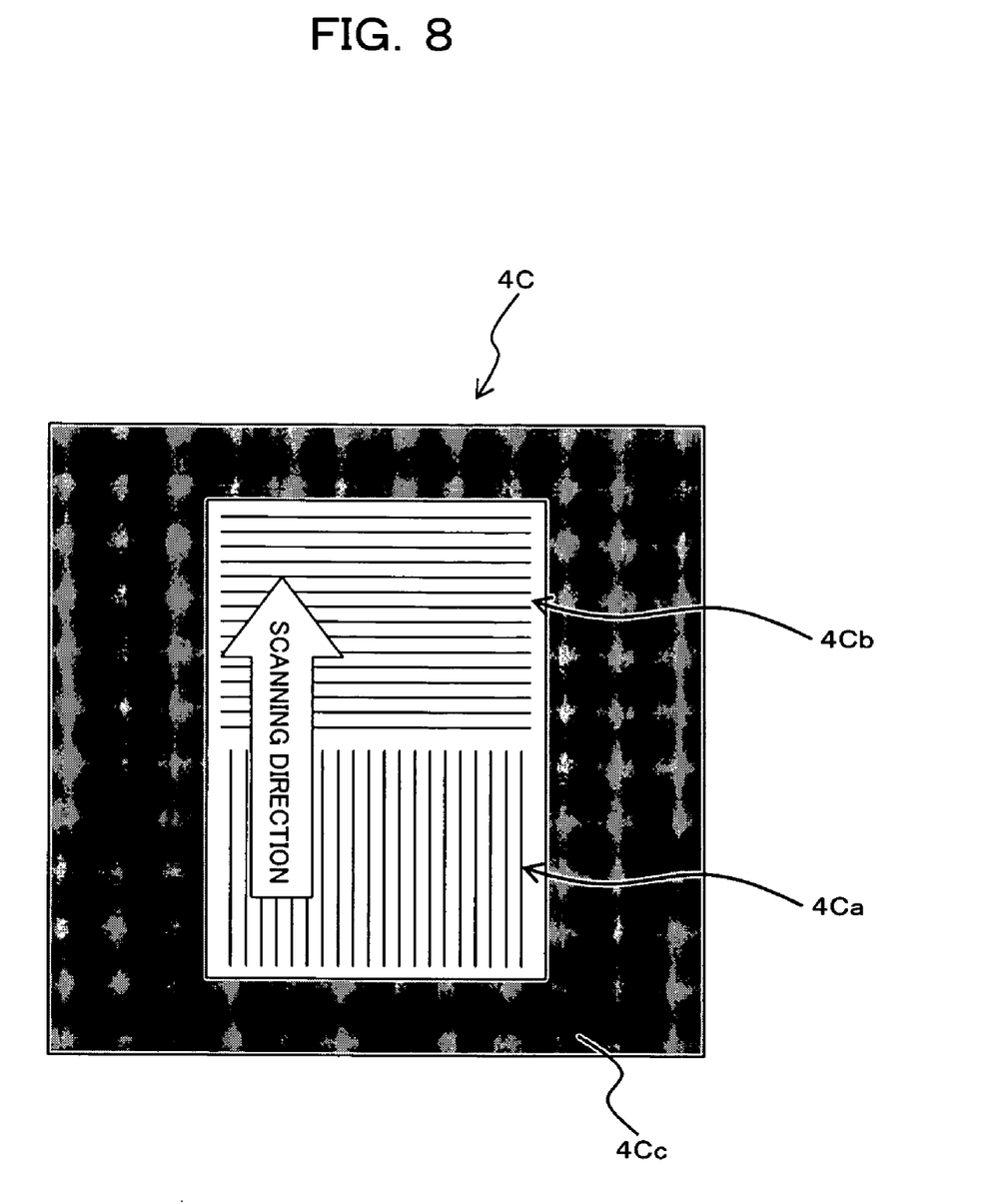
FIG. 8 is a plain view schematically showing a mask used for measuring a flare amount in a method for measuring an amount of flare according to the third embodiment of the present invention.

As shown in FIG. 8, a method for measuring an amount of flare, a mask used for measuring an amount of flare, and a method for manufacturing a device of the present embodiment are different in mask pattern and in lighting system from the above first embodiment (see FIG. 3).

In the present embodiment, a mask (a mask used in measuring of an amount of flare, a reticle) 4C has, as shown in FIG. 8, a number of (here, two) line patterns 4Ca and 4Cb in blocks which are arranged at different angles relative to the scanning direction and in which lines are arranged in equal pitches. In FIG. 8, reference number 4Cc represents a shading section.

In this example, one line pattern (first line pattern) 4Ca has a number of lines that extend in the scanning direction and that are arranged in a direction perpendicular to the scanning line at equal pitches.

The other line pattern (second line pattern) 4Cb has a number of lines that extend in a direction perpendicular to the scanning direction and that are arranged in the scanning direction at equal pitches.

Figure 9A:
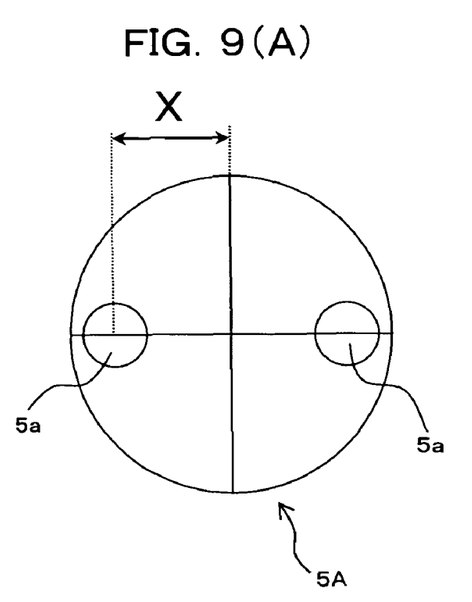
FIGS. 9(A) and 9(B) are diagrams schematically showing bi-poled illumination system used in a method for measuring an amount of flare according to the third embodiment of the present invention.
Figure 9B:
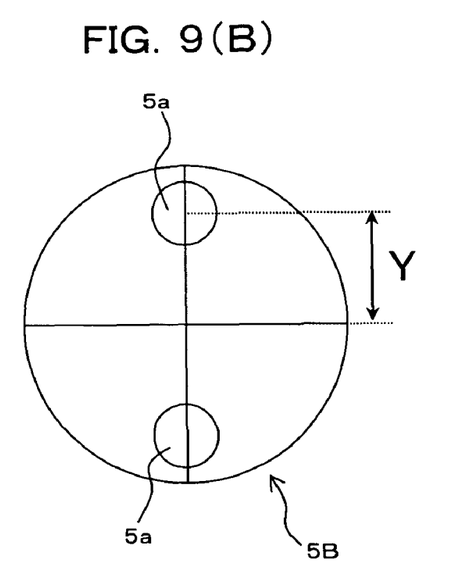
Figure 10:
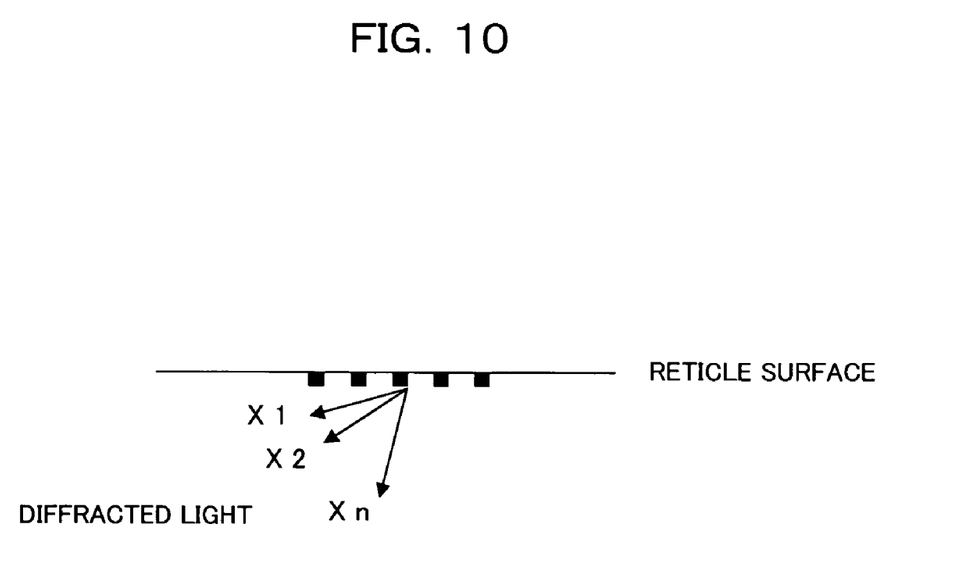
FIG. 10 is a diagram schematically showing angles of diffracted light in accordance with various positions of the bi-poled illumination system of the third embodiment.

Further, the present embodiment uses bi-poled illumination system 5A and 5B as shown in FIGS. 9(A) and 9(B). As the lighting system for the first line pattern 4Ca of the mask 4C, bi-poled illumination system 5A (having two lightings 5a separately arranged in a direction perpendicular to the scanning direction) of FIG. 9(A) is used; and bi-poled illumination system 5B (having two lightings 5a separately arranged in the scanning direction) of FIG. 9(B) is used as lighting system for the second line pattern 4Cb of the mask 4C.

As described above, even when line patterns 4Ca and 4Cb have equal pitches, exposure using bi-poled illumination system 5A and 5B causes light to be diffracted at a particular angle so that an amount of flare caused by diffracted light can be quantitatively measured in addition to specification of the position of the flare caused by diffracted light.

In particular, variation in position of two lightings 5a that form bi-poled illumination system 5A or 5B can control an angle (diffraction angle) of diffracted light. For example, variation in position (X or Y from the center) of two lightings 5a that form bi-poled illumination system 5A or 5B changes an angle of light diffracted by line pattern formed on the mask surface (reticle surface), as shown in FIG. 10. As described above, exposure (transfer) under various exposure conditions makes it possible to specify the position of flare corresponding to an angle of diffracted light and also to quantitatively measure an amount of the flare corresponding to the angle of the diffracted light. That specification and measurement utilizes the characteristic that an angle of diffraction depends on an incident angle of light.

If the mask 4C is used, in addition to the film thickness (the remaining amount) of the resist 3, the length of each line and each pitch between lines of a pattern (a resist pattern) transferred to the resist 3 are also measured in order to measure an amount of flare. Further, an amount of flare caused by diffracted light is measured based on amounts of remaining film of the resist 3 and dimensions of transferred patterns which are measured under various exposure condition.

The mask configuration, the method for measuring an amount of flare, and the method for manufacturing a device of the present embodiment are identical to those of the first embodiment, so repetitious description is omitted here.

According to the method for measuring an amount of flare, the mask used for measuring an amount of flare, and the method for manufacturing a device of the second embodiment, it is possible to measure an accurate amount of flare caused by diffracted light in a simple manner.

Especially, if a routine check is performed using the method measuring an amount of flare during a process for manufacturing a device, time to replace and clean optical parts, for example, can be properly determined with ease so that, advantageously, apparatuses used in device manufacturing can be easily managed. Further, replacement or cleaning of optical parts can avoid decline in evenness of dimensions beforehand, resulting in prohibited decline in device performance and in yield.

(d) Others

The present invention should by no means be limited to the foregoing embodiments and various changes or modifications may be suggested without departing from the gist of the invention. For example, the methods for measuring a flare amount according to the above embodiments may be independently carried out or alternatively may be performed in arbitrary combinations.

What is claimed is:

1. A method for measuring an amount of flare, comprising the steps of:
   (a) applying a photosensitive material to a substrate;
   (b) exposing the photosensitive material only once using a mask including a pattern formed from one transmitting section surrounded by a shading section, an entire area of the pattern formed from the one transmitting section being a region transmitting light and the pattern formed from the one transmitting section having no shading pattern, such that a part of the photosensitive material in a thickness direction remains in a first region corresponding to the transmitting section of the mask; and
   (c) measuring an amount of flare based on a distribution of film thickness of the photosensitive material remaining in the first region and a second region other than the first region after said step (b) of exposing.

2. The method for measuring an amount of flare according to claim 1, further comprising the step of (d) measuring an intensity of illumination on the first region corresponding to the transmitting section, wherein the amount of flare is measured based on the film thickness of the photosensitive material remaining after said step (b) of exposing on the first region and the intensity of illumination on the first region.

3. The method for measuring an amount of flare according to claim 1, wherein:

the mask used in said step (b) of exposing has a line pattern; and an amount of flare caused by diffracted light is measured based on the thickness of the photosensitive material remaining after said step (b) of exposing on the first region and on the second region and dimensions of a pattern transferred to the photosensitive material.

4. The method for measuring an amount of flare according to claim 3, wherein the mask has a plurality of line patterns which have different pitches at which line are arranged.

5. The method for measuring an amount of flare according to claim 3, bi-poled illumination system is used in said step (b) of exposing.

6. The method for measuring an amount of flare according to claim 5, wherein:

the mask has a line pattern in which lines are arranged at fixed pitches; and the amount of flare caused by diffracted light is measured based on the film thickness of the photosensitive material remained after said step (b) of exposing on the first region and the second region and dimensions of a pattern transferred to the photosensitive material in said step (b) of exposing.

7. The method for measuring an amount of flare according to claim 1, wherein the photosensitive material is a photoresist.

8. A method for manufacturing a device comprising a process for measuring an amount of flare using a method defined in claim 1.

9. The method for measuring an amount of flare according to claim 1, wherein the mask comprises a plurality of line patterns which are arranged in a direction of scanning and which have different pitches at which lines are arranged.

10. The method for measuring an amount of flare according to claim 1, wherein the mask comprises a line pattern in which a plurality of lines are arranged at different pitches relative to the direction of scanning.

11. The method for measuring an amount of flare according to claim 1, wherein the mask comprises a plurality of line patterns in blocks in which lines are arranged at equal pitches and which line patterns are arranged in different directions respectively to relative a direction of scanning.

* * * * *